(12) United States Patent
Weidman et al.

(10) Patent No.: US 8,465,903 B2
(45) Date of Patent: Jun. 18, 2013

(54) RADIATION PATTERNABLE CVD FILM

(75) Inventors: Timothy W. Weidman, Sunnyvale, CA (US); Timothy Michaelson, Milpitas, CA (US); Paul Deaton, San Jose, CA (US); Nitin K. Ingle, Santa Clara, CA (US); Abhijit Basu Mallick, Palo Alto, CA (US); Amit Chatterjee, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 74 days.

(21) Appl. No.: 13/267,341

(22) Filed: Oct. 6, 2011

(65) Prior Publication Data
US 2012/0088193 A1    Apr. 12, 2012

Related U.S. Application Data

(60) Provisional application No. 61/390,396, filed on Oct. 6, 2010.

(51) Int. Cl.
| | | |
|---|---|---|
| G03C 5/00 | (2006.01) | |
| G03F 7/00 | (2006.01) | |
| G03F 7/027 | (2006.01) | |
| G03F 7/039 | (2006.01) | |
| G03F 7/075 | (2006.01) | |

(52) U.S. Cl.
USPC ........... 430/296; 430/325; 430/327; 430/328; 430/330; 430/331; 430/942; 430/966; 430/967

(58) Field of Classification Search
USPC ................. 430/296, 325, 327, 328, 330, 331, 430/942, 966, 967
See application file for complete search history.

(56) References Cited

U.S. PATENT DOCUMENTS

| | | | |
|---|---|---|---|
| 5,885,751 | A | 3/1999 | Weidman et al. |
| 6,238,844 | B1 | 5/2001 | Joubert et al. |
| 6,262,181 | B1 | 7/2001 | Bantu et al. |
| 6,573,030 | B1 | 6/2003 | Fairbairn et al. |
| 6,821,718 | B2 | 11/2004 | Angelopoulos et al. |
| 6,989,227 | B2 | 1/2006 | Weidman et al. |
| 2005/0074689 | A1 | 4/2005 | Angelopoulos et al. |
| 2009/0208880 | A1 | 8/2009 | Nemani et al. |

FOREIGN PATENT DOCUMENTS

KR    2001-0019924    3/2001

OTHER PUBLICATIONS

Burton, B. B. et al., "SiO2 Atomic Layer Deposition Using Tris(dimethylamino)silane and Hydrogen Peroxide Studied by in Situ Transmission FTIR Spectoscopy", *J. Phys. Chem. C XXXX*, 9 pgs.

PCT International Search Report and Written Opinion in PCT/US2011/055074, mailed May 4, 2012, 12 pgs.

PCT International Search Report & Written Opinion in PCT/US2011/055102, mailed Apr. 13, 2012, 7 pgs.

"International Preliminary Report on Patentability for PCT/US2011/055102", mailed on Apr. 18, 2013, 5 pgs.

*Primary Examiner* — Christopher Young (74) *Attorney, Agent, or Firm* — Servilla Whitney LLC (57) ABSTRACT

Methods for forming photoresists sensitive to radiation on a substrate are provided. Described are chemical vapor deposition methods of forming films (e.g., silicon-containing films) as photoresists using a plasma which may be exposed to radiation to form a pattern. The deposition methods utilize precursors with cross-linkable moieties that will cross-link upon exposure to radiation. Radiation may be carried out in the with or without the presence of oxygen. Exposed or unexposed areas may then be developed in an aqueous base developer.

20 Claims, 5 Drawing Sheets

RADIATION PATTERNABLE CVD FILM

BACKGROUND

Embodiments of the present invention generally relate to radiation sensitive photoresist materials and methods of manufacturing and patterning such photoresists.

In the manufacture of integrated circuits (IC) or chips, patterned exposure of light is used to define useful shapes or features on the surface of a substrate such a semiconductor wafer, typically in a photosensitive photoresist material. Feature sizes on chips are continually becoming smaller, requiring more sophisticated shorter wavelength lithography technologies. Next generation lithography (NGL) is expected to replace the current optical lithography method, for example, in the 20 nm technology node and beyond. Extreme ultraviolet (EUV) lithography (EUVL) EUVL shows promise as a next generation lithography technique, as well as electron beam (e-beam) lithography.

Extreme ultraviolet lithography ("EUVL") employs short wavelength radiation ("light") in the approximate range of 10 nanometers (nm) to 15 nm to pattern features having a size smaller than 100 nm. Because extreme ultraviolet ("EUV") radiation is absorbed in almost all materials, a mask used in the EUVL is a reflective mask. The reflective mask reflects the radiation in certain regions and absorbs the radiation in other regions of the mask. Light reflected from the mask reproduces an image of the mask on photoresist (or "resist") disposed on a wafer substrate such as silicon. When illuminated or exposed to radiation, the photoresist undergoes chemical reactions and is then developed to produce a replicated pattern of the mask on the wafer.

However, as pattern sizes shrink, thicker photoresists are problematic. Such problems arise during development, where the surface tension the solution pulls on the lines of the pattern, which is known as pattern collapse. Thus, there is a need for thinner photoresists, to achieve lower aspect ratios of the features, as well as preventing pattern collapse.

Desirable attributes of resist materials sensitive to radiation include one or more of robust adhesion, thermal and mechanical stability, and removability using plasma etching or stripping, for example, oxygen plasma etching. Since EUV and other types of lithography exposures, such as e-beam, are conducted under vacuum, outgassing of volatile components, which may contaminate expensive reflective multilayer optical elements, should be minimized or eliminated. It may also be desirable for the resist to exhibit sufficient conductivity to minimize proximity effects associated with secondary electrons generated during exposure to radiation.

SUMMARY OF THE INVENTION

A first aspect of the invention relates to a method for forming a radiation sensitive photoresist on a substrate. The method comprises forming by chemical vapor deposition a deposited layer by flowing a silicon precursor containing substituents with cross-linkable moieties into a chemical vapor deposition apparatus containing the substrate, contacting the deposited layer with a plasma; and selectively exposing portions of the deposited layer to radiation to create a pattern having exposed portions and unexposed portions in which the exposed portions of the deposited layer contain cross-linked moieties that form a film on the substrate that are less soluble to developer solution than unexposed portions of the deposited layer. In some embodiments, exposure to radiation is carried out in a vacuum. In further embodiments, the radiation is selected from EUV and e-beam. Alternatively, in other embodiments, exposure to radiation is carried out in the presence of oxygen. In further embodiments, the radiation is selected from deep UV, far UV and x-ray. In other embodiments, the method further comprises flowing a second precursor comprising germanium or tin, and wherein the radiation is EUV. The photo-patterned film may be used as a hard mask. In other embodiments, the plasma may be a remote plasma.

In yet other embodiments, the method further comprises contacting the unexposed portions of the deposited layer with developer solution and removing the unexposed portions from the substrate. In more specific embodiments, the developer solution comprises an aqueous solution of tetramethylammonium hydroxide.

In certain embodiments of this aspect, the silicon precursor comprises an SiH-containing precursor. According to specific variants of this embodiment, the Si—H containing precursor is selected from trisilylamine, bis(diethylamino)silane, bis(tertiarybutylamino)silane, tris(dimethylamino)silane, and 1,3,5-trisilapentane.

Another aspect of the invention relates to a method of providing a substantially oxidized photo-patterned film. The method comprises providing a substrate, depositing a film onto the substrate using an Si—H containing precursor, wherein deposition comprises plasma-enhanced chemical vapor deposition, exposing at least part of the deposited film to provide a photo-patterned film, and treating the photo-patterned film to provide a substantially oxidized photo-patterned film. In some embodiments, treating the photo-patterned film comprises one or more of baking at an elevated temperature, UV curing, exposing the photo-patterned film to ozone, and exposing the photo-patterned film to a plasma containing oxygen. In certain other embodiments, the UV light is selected from deep UV and far UV light.

According to certain embodiments of this aspect, the method may further comprise contacting the unexposed portions of the deposited layer with developer solution and removing the unexposed portions from the substrate. In specific variants, the developer solution is an aqueous tetramethylammonium hydroxide solution. The photo-patterned film is used as a hard mask. In one or more embodiments, the Si—H containing precursor is one or more of trisilylamine, bis(diethylamino)silane, bis(tertiarybutylamino)silane, tris(dimethylamino)silane, and 1,3,5-trisilapentane.

A third aspect of the invention relates to a method for forming a patterned photoresist on a substrate comprising depositing a layer by chemical vapor deposition on a substrate by flowing an Si—H containing precursor containing cross-linkable moieties into a chemical vapor deposition chamber containing the substrate, contacting the deposited layer with a plasma, wherein the plasma comprises nitrogen, selectively exposing portions of the layer to radiation provide exposed portions and unexposed portions to form a pattern in which exposed portions are more cross-linked than unexposed portions, and contacting the unexposed portions of the deposited layer with developer solution, wherein the developer solution comprises TMAH, and removing the unexposed portions from the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide radiation sensitive photoresist materials and methods of manufacturing and patterning such photoresists. In accordance with certain embodiments, the precursors deposit a film that contains reactive, cross-linkable moieties which cross-link upon exposure to radiation but remain partially unreacted in the deposited layer not exposed to radiation. The unexposed portions remain soluble in developer solution One embodiment pertains to methods of manufacturing ultrathin, high performance EUV sensitive photoresist layers, for example by deposition via PECVD. However, the invention is not limited to EUV, and other radiation can be used according to one or more embodiments. In certain embodiments, radiation to exposure is carried out without the presence of oxygen, particularly those where exposure is carried out in a vacuum. In specific embodiments, the radiation can be electron beam (or e-beam), which can be used in patterning photoresist. In other embodiments, radiation can be carried out in the presence of oxygen, which may incorporate oxide into cross-linked precursors film. The film can be further oxidized if desired, according to one or more embodiments described herein. The deposited material may be used as a hardmask with or without additional oxidation such that a separate photoresist does not have to be used. Collectively, such radiation, including, but not limited to, EUV and electron beam (or e-beam or EB), UV, deep UV, far UV, x-ray will be considered suitable forms of radiation methods.

As used herein, "far UV" refers to radiation at a wavelength below 200 nm. "Deep UV" refers to radiation at a wavelength below 300 nm. As used herein, "extreme UV" (or "EUV") refers to radiation in the approximate range of 5 nanometers (nm) to 120 nm, and in specific embodiments, in the range of 10 nm to 15 nm. "Electron beam" lithography, "E-beam" lithography or "EBL" refers to lithography using an electron beam generated from a source, for example $LaB_6$ that is made to pass through an assembly of lenses and manipulated by deflectors, etc. to expose the resist film. "X-ray" lithography refers to techniques for exposing photoresist using x-ray radiation.

As used herein, an "SiH-containing precursor" refers to a precursor molecule that contains a plurality of Si—H bonds. SiH-containing precursors include silanes and carbosilanes. The term "silanes" refers to compounds which contain silicon and hydrogen atoms, including silicon-to-hydrogen bonds. The term "carbosilanes," which will be used interchangeably with "organosilanes," refers to compounds that contain silicon, hydrogen and carbon atoms, and contain at least one carbon-to-silicon covalent bond.

As used in this patent application, "chemical vapor deposition" or "CVD" refers to a process in which one or more reactants continuously form a film on a substrate by reaction in a process chamber containing the substrate or on the surface of the substrate. Chemical vapor deposition is distinguished from atomic layer deposition (ALD) in that ALD involves the self-limiting formation of stacked atomic or molecular layers by sequential exposure of the substrate to various precursors.

According to one or more embodiments, radiation such as EUV can be used in the direct patterning of features as small as 10 nm utilizing a resist layer that has a thickness that is also as small as 10 nm, but generally in the range of 10 nm to 30 nm. Photoresist layers having a thickness on the order of 200 Angstroms (20 nm) are of interest because this value approximates the penetration depth of radiation such as EUV light in many materials. Presently available organic resists are required to be about twice this value (400 Angstroms and higher) to provide reasonable etch resistance, however, at the expense of degradation of resolution when employed for EUV applications.

According to various embodiments of the invention, "dry" deposition techniques such as chemical vapor deposition (CVD) provide the unique ability to assemble a film with not only good control of thickness, but also utilize mild deposition conditions and create developer solubility (e.g., reactivity with aqueous developers) together with high sensitivity to EUV (and other radiation carried out in a vacuum such as electron beam) involving cross-linking with the loss of solubility, thus allowing patterns to be developed.

The films deposited according to one or more embodiments of the invention are substantially etch resistant, and allow much thinner layers to be used as photoresist. The ability to use thinner layers is advantageous because, it lowers the aspect ratio of the printed features and prevents the pattern collapse problems discussed above. Additionally, as EUV light is absorbed heavily in most materials, as discussed above, thinner photoresist layers help to prevent a large gradient in light intensity from the top to the bottom of the photoresist.

The films may be patterned with or without the presence of oxygen. Where films are patterned in the presence of oxygen, any radiation that can be carried out in the presence of oxygen can be utilized. Furthermore, the films may be patterned without requiring oxygen. Thus, photopatterning may occur by using radiation conducted in a vacuum environment, including e-beam or EUV light. Regardless of whether oxygen is present, upon exposure to such radiation, the deposited film crosslinks, becoming insoluble in aqueous basic developer solution. The unexposed portions of the films can then be dissolved in TMAH, which is one of the most commonly used developers with conventional photoresists. While not wishing to be bound by any particular theory, it is thought that $H_2$ is lost upon exposure to the radiation, thereby densifying the material and making it less reactive to developer solutions.

Accordingly, one aspect of the invention relates to a method for forming a radiation sensitive photoresist on a substrate. The method comprises forming, by chemical vapor deposition, a deposited layer by flowing a precursor containing substituents with cross-linkable moieties into a chemical vapor deposition apparatus containing the substrate, contacting the deposited layer with a plasma, and selectively exposing portions of the deposited layer to radiation to create a pattern having exposed portions and unexposed portions in which the exposed portions of the deposited layer contain cross-linked moieties that form a film on the substrate that is less soluble to developer solution than unexposed portions of the deposited layer.

In accordance with this aspect, radiation may be performed without oxygen, such as in a vacuum, is suitable for the process. Suitable forms of radiation carried out in a vacuum include, but are not limited to, EUV and e-beam. In one embodiment, the cross-linkable moieties present in the precursor include Si—H bonds (e.g., is an Si—H containing precursor). In other embodiments, radiation may take place in the presence of oxygen. Such radiation includes, but is not limited to, deep UV, far UV and x-ray radiation.

Regardless of the occurrence of oxidation, in certain embodiments, the unexposed portions of the deposited layer may then be contacted with developer solution to remove the unexposed portions from the substrate. In a particular embodiment, the developer solution comprises tetramethylammonium hydroxide (TMAH). Alternatively, the method may feature selectively exposing portions of the deposited layer to radiation to create a pattern having exposed portions and unexposed portions in which the exposed portions of the deposited layer contain cross-linked moieties that form a film on the substrate that are more soluble to developer solution than unexposed portions of the deposited layer. In this case, the deposited layer may be contacted with a developer solution to remove the exposed portions from the substrate.

In accordance with certain embodiments, the precursor may comprise an SiH-containing precursor. The precursor may be a silane or carbosilane in several embodiments, In other embodiments, the precursor comprises a volatile silicon-containing precursor. In yet more specific embodiments, the precursor is selected from the group trisilylamine, bis(diethylamino)silane, bis(tertiarybutylamino)silane, tris(dimethylamino)silane, and 1,3,5-trisilapentane. In yet a more specific embodiment, the precursor is trisilylamine.

There are numerous potentially useful combinations of reactive substituents which can be utilized to impart sensitivity to radiation, an example including the presence of Si—H bonds. While materials with such functionality can be prepared in forms suitable for spin-coating, formulations for doing so can prove either too unstable (for example, to traces of air, moisture, handling at room temperature, etc.) or require too high an EUV dose to be practical. Because embodiments of the CVD EUV resist process are performed in a vacuum chamber environment, and EUV exposure will also be performed in vacuum, reliable coating, handling and exposure of films can be achieved even with materials exhibiting a high content of Si—H. Similarly, e-beam radiation is also carried out in a vacuum. Because such radiation is carried out in a vacuum, oxidation is not likely to be involved.

However, where radiation does occur in the presence of oxygen, oxidation is likely to be involved. The film may be oxidized separately after exposure to radiation. Accordingly, another aspect of the invention relates to a method of providing a substantially oxidized photo-patterned film, the method comprising: providing a substrate, depositing a film onto the substrate using an Si—H containing precursor, wherein deposition comprises plasma-enhanced chemical vapor deposition, exposing at least part of the deposited film to radiation to provide a photo-patterned film, and treating the photo-patterned film to provide a substantially oxidized photo-patterned film. The radiation may be carried out in the presence of oxygen.

Additional oxidation to provide a substantially oxidized photo-patterned film can be accomplished in a variety of ways with minimal change of dimension (i.e., shrinkage, expansion, etc.). The photo-patterned film can be treated by one or more of baking at an elevated temperature, UV curing, exposing the photo-patterned film to ozone, and exposing the photo-patterned film to a plasma containing oxygen. As before, regardless of the occurrence of oxidation, in certain embodiments, the unexposed portions of the deposited layer may then be contacted with developer solution to remove the unexposed portions from the substrate. In a particular embodiment, the developer solution comprises tetramethylammonium hydroxide (TMAH). Alternatively, the method may feature selectively exposing portions of the deposited layer to radiation to create a pattern having exposed portions and unexposed portions in which the exposed portions of the deposited layer contain cross-linked moieties that form a film on the substrate that are more soluble to developer solution than unexposed portions of the deposited layer. In this case, the deposited layer may be contacted with a developer solution to remove the exposed portions from the substrate.

Another aspect of the invention relates to a method for forming a patterned photoresist on a substrate comprising depositing a layer by chemical vapor deposition on a substrate by flowing an Si—H containing precursor containing cross-linkable moieties into a chemical vapor deposition chamber containing the substrate, contacting the deposited layer with a low power plasma, wherein the plasma comprises nitrogen, and selectively exposing portions of the layer to radiation selected from EUV and e-beam to provide exposed portions and unexposed portions to form a pattern in which exposed portions are more cross-linked than unexposed portions. In one embodiment, the exposed portions of the layer form a cross-linked silicon containing film on the substrate. In certain embodiments, the Si—H containing precursor is selected from the group trisilylamine, bis(diethylamino)silane, bis(tertiarybutylamino)silane, tris(dimethylamino)silane, and 1,3,5-trisilapentane. In a specific embodiment, the Si—H containing precursor comprises trisilylamine. In another embodiment, the exposed portions of the deposited layer provide a mask for the underlayer.

In one embodiment of this aspect, selectively exposing portions of the layer provides unexposed portions of the deposited layer that are more soluble in a developer solution than the exposed portions. Alternatively, in another embodiment, selectively exposing portions of the layer provides unexposed portions of the deposited layer that are less soluble in a developer solution than the exposed portions.

In certain other embodiments, prior to forming the deposited layer, an underlayer is deposited on the substrate. In a more specific variation, the underlayer comprises amorphous carbon.

In a third aspect of the invention, a patterned photoresist on a substrate is formed, the method comprising flowing trisilylamine precursor into a chamber containing the substrate to form a deposited layer on the substrate, contacting the deposited layer with a low power plasma, and selectively exposing portions of the deposited layer to radiation in a vacuum to form a pattern in which exposed portions of the deposited layer is more cross-linked than unexposed portions of the deposited layer on the substrate. In a specific embodiment of this aspect, the radiation is selected from EUV and e-beam.

In a fourth aspect of the invention, provided is a method for forming a patterned photoresist on a substrate comprising depositing a layer by chemical vapor deposition on a substrate by flowing an Si—H containing precursor containing cross-linkable moieties into a chemical vapor deposition chamber containing the substrate, contacting the deposited layer with a plasma, wherein the plasma comprises nitrogen, selectively exposing portions of the layer to radiation provide exposed portions and unexposed portions to form a pattern in which exposed portions are more cross-linked than unexposed portions, contacting the unexposed portions of the deposited layer with developer solution, wherein the developer solution comprises TMAH, and removing the unexposed portions from the substrate.

The precursors may be in a state of gas, plasma, vapor or other state of matter useful for a vapor deposition process. During the purge, typically an inert gas is introduced into the processing chamber to purge the reaction zone or otherwise remove any residual reactive compound or by-products from the reaction zone.

Of course, the aforementioned CVD processes are merely exemplary of any CVD process reactants in which reactive, cross-linkable moieties present in the precursors remain partially unreacted in the deposited layer which is soluble in developer solution. The deposited layer containing partially unreacted, cross-linkable moieties may then be selectively exposed to extreme ultraviolet light, e-beam radiation, or any other radiation carried out in a vacuum to create a pattern so that exposed portions of the deposited layer contain cross-linked moieties from the first and second precursors to form a metal oxide precursor on the substrate that is less soluble to developer solution than unexposed portions of the deposited layer.

A "deposition gas" or a "process gas" as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma or vapor, during the vapor deposition process. Also, a process may contain a purge gas or a carrier gas and not contain a reactive compound.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

The precursors are typically in vapor or gas form. The precursors may be delivered with a carrier gas. A carrier gas, a purge gas, a deposition gas, or other process gas may contain nitrogen, hydrogen, argon, neon, helium, or combinations thereof. Plasmas may also be useful for depositing, forming, annealing, treating, or other processing of photoresist materials described herein. The various plasmas described herein, such as the nitrogen plasma or the inert gas plasma, may be ignited from and/or contain a plasma reactant gas. In some examples, the plasma may involve mixtures nitrogen and hydrogen or contain ammonia ($NH_3$) a compound of nitrogen and hydrogen.

During PECVD processes, a plasma may be generated from a microwave (MW) frequency generator or a radio frequency (RF) generator. In accordance with certain embodiments during the plasma step, the reagents are generally ionized during the process, though this might occur only upstream of the deposition chamber such that ions or other energetic or light emitting species are not in direct contact with the depositing film. This configuration is often termed a remote plasma. Thus in this type of PECVD process, which will generally be most applicable to the formation of films which retain far and EUV reactivity, the plasma is generated external from the processing chamber, such as by a remote plasma generator system. Where the plasma is not a remote plasma, low power plasmas may be used. An example of a low power plasma is one that has an RF value of about 100 W.

In one or more embodiments, the various gases for the process may be pulsed into an inlet, through a gas channel, from various holes or outlets, and into a central channel. In one or more embodiments, the deposition gases may be pulsed to and through a showerhead. Alternatively, as described above, the gases can flow simultaneously through gas supply nozzle or head and the substrate and/or the gas supply head can be moved so that the substrate is exposed to the gases.

Embodiments of the invention provide a method for depositing or forming radiation sensitive photoresist on a substrate during a vapor deposition process, such as chemical vapor deposition (CVD) or plasma-enhanced CVD (PE-CVD). A processing chamber is configured to expose the substrate to a sequence of gases and/or plasmas during the vapor deposition process. The processing chamber would include separate supplies of the precursors, along with a supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a CVD process as described herein. Central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

Thus, another aspect of the invention pertains to an apparatus for deposition of a film on a substrate to perform a process according to any of the embodiments described above. In one embodiment, the apparatus comprises a deposition chamber for CVD or PECVD of a film on a substrate. The chamber comprises a process area for supporting a substrate. The apparatus include a first inlet in fluid communication with a supply of a precursor. The apparatus further includes a second inlet in fluid communication with a purge gas. The apparatus can further include a vacuum port for removing gas from the deposition chamber. The apparatus can further include a fourth inlet for supplying one or more auxiliary gases such as inert gases to the deposition chamber.

The deposition can further include a means for heating the substrate by radiant and/or resistive heat.

In some embodiments, a plasma system and processing chambers or systems which may be used during methods described here for depositing or forming photoresist materials can be performed on either PRODUCER®, CENTURA®, or ENDURA® systems, all available from Applied Materials, Inc., located in Santa Clara, Calif.

The CVD process provides that the processing chamber or the deposition chamber may be pressurized at a pressure within a range from about 0.01 Torr to about 100 Torr, for example from about 0.1 Torr to about 10 Torr, and more specifically, from about 0.5 Torr to about 5 Torr. Also, according to one or more embodiments, the chamber or the substrate may be heated to a temperature of less than about 250° C., for example, about 150° C. or less, such as within a range from about 50° C. to about 100° C., and in other embodiments less than about 300° C., less than about 200° C., or less than about 100° C.

Additional reactants may be used, where it is desired to control the absorbance of radiation. For example, it may be advantageous to control the absorbance at EUV wavelengths. This may be accomplished by the use of tin or germanium. In general, the use of higher atomic number elements will correspond to more absorbance.

Other applications of the embodiments of the invention provided include other lithography applications, as well as during the creation of holograms.

Exemplary embodiments of a chemical vapor deposition process cycles will now be described.

Precursors

Non-limiting examples of precursors include compounds of silicon. In some embodiments, the precursor will be an SiH containing precursor. Some specific examples of silicon based precursors useful for subsequent radiation such as EUV crosslinking reactions include, but are not limited to, trisilylamine, bis(diethylamino)silane, bis(tertiarybutylamino)silane, tris(dimethylamino)silane, and 1,3,5-trisilapentane.

The as deposited, film formed by PECVD in the can be exposed to patterned radiation such as EUV light (e.g., through a mask (not shown) to promote cross-linking to form a dense, glasslike material in the regions exposed to EUV light with greatly decreased solubility in aqueous developers or non-aqueous developers such as organic solvents it is also within the scope of the invention to use dry development methods such as plasma etch.

It will be understood that the resulting patterns can be developed to provide either negative tone or positive tone patterns, using either a liquid developer or a plasma based "dry" approach. Such photolithography techniques are advantageous in that the deposition, development, patterning, and etching steps may all be performed in the gas phase, i.e., using dry processing techniques, such as dry plasma, reducing the potential for pattern collapse and thereby providing improved resolution.

The substrate with an EUV patterned CVD resist layer can be placed in a dilute water based etchant, including any suitable photoresist developer such as dilute tetramethyl ammonium hydroxide (TMAH) developer, aqueous triethanolamine, dilute fluoride, and mixtures thereof to remove the unexposed regions Further examples of general and specific process sequences according to various embodiments will now be described.

A substrate can be any type of substrate described above. In one or more embodiments, a specific underlayer may first be applied to the substrate. In specific embodiments, the underlayer can be a carbon based polymeric layer or an amorphous carbon based layer of the type described in U.S. Pat. Nos. 6,573,030; 6,841,341; 7,223,526; and 7,335,462. Such a layer can be deposited by a variety of techniques, for example, by the plasma induced polymerization of unsaturated monomeric precursors such as ethylene, propylene, acetylene, or any other volatile hydrocarbon based precursor useful in processes already implemented for the deposition of Applied Materials Advanced Patterning Film (APF®) layers, which can be produced in an APF® chamber on the Producer® system, available from Applied Materials, Inc.

Delivery of the Precursor

Figure 1A:
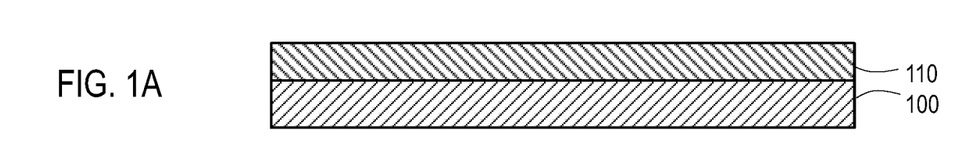
FIGS. 1A-1C show an embodiment of deposition process for depositing a photoresist layer and forming a pattern on a substrate.

The substrate surface can be exposed to a precursor gas or vapor formed by passing a carrier gas (for example, nitrogen or argon) through an ampoule of the precursor, which may be in liquid form. The ampoule may be heated. However, if the precursor is sufficiently volatile, then a carrier gas is not needed, and the precursor can be flowed by itself. The precursor gas can be delivered at any suitable flow rate within a range from about 10 sccm to about 2,000 sccm, for example, from about 50 sccm to about 1,000 sccm, and in specific embodiments, from about 100 sccm to about 500 sccm, for example, about 200 sccm. The substrate may be exposed to precursor gas and plasma for a time period within a range from about 0.1 seconds to about 120 seconds, for example, from about 5 second to about 60 seconds, and in a specific example, for approximately 10 seconds. With PECVD, the plasma may comprise nitrogen, hydrogen, argon, xenon, helium, ammonia, or other gasses, or combinations thereof, Exposure to Radiation FIG. 1A shows substrate 100 with a deposited layer 110 on the substrate, formed by CVD. The deposited layer 110 comprises the reactive, cross-linkable moieties present in the precursor that remain partially unreacted in the deposited layer 110 which is soluble in developer solution.

Figure 1B:
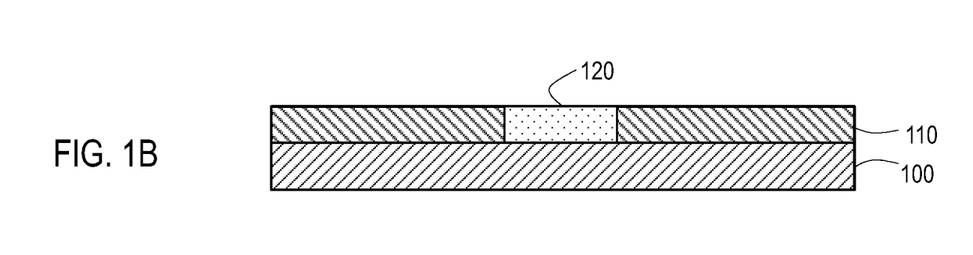
Figure 1C:
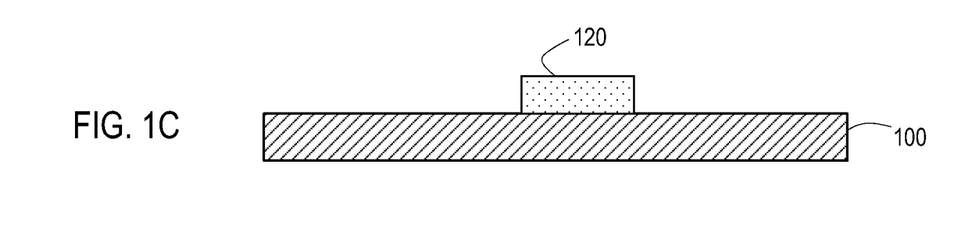

The deposited layer 110 containing the cross-linkable moieties is then selectively exposed to radiation. The radiation may be carried out in the absence of oxygen, such as in a vacuum. Examples of such radiation include extreme ultraviolet light or e-beam. The radiation may also be carried out in the presence of oxygen, which will incorporate some oxygen into the film. Regardless, exposure to radiation creates a pattern so that exposed portions of the deposited layer contain cross-linked moieties from the precursor to form a silicon-containing film on the substrate that is less soluble in developer solution than unexposed portions. As shown in FIG. 1B, portions 120 of the deposited film have been exposed to radiation to form an area of cross-linked material that is less soluble in developer solution. The remaining portions of the deposited layer 110 still contain reactive, cross-linkable moieties present in the precursor that remain partially unreacted in the deposited layer and therefore soluble in a developer solution, such as TMAH. Thus, exposed portion 120 of the deposited layer contains cross-linked moieties from the precursor, and is therefore less soluble in developer solution than unexposed portions of the deposited layer 110. The substrate is then be exposed to a suitable developer solution to rinse away the unexposed portions of the deposited layer 120 to provide the patterned layer as shown in FIG. 1C.

The CVD photoresist may be deposited with a thickness less than about 500 Angstroms, for example, between about 300 Angstroms and about 100 Angstroms, and in a specific example about 200 Angstroms. However, the final thickness of the material will ultimately depend on the desired application or use of the photoresist material.

Formation of Photoresist on a Substrate with an Underlayer

As discussed above, a substrate can include an underlayer. Referring now to FIGS. 2A-2D, a substrate 200 having an underlayer 210 thereon is shown. In specific embodiments, the underlayer 210 can be an amorphous carbon underlayer. In other embodiments, the underlayer can be a spin-coated organic underlayer. Amorphous carbon underlayers and method for their formation are described in commonly assigned U.S. Pat. Nos. 6,573,030; 6841,341; 7,223,526; and 7,335,462. The amorphous carbon layer has an etch selectivity in the range of 100:1 and 10:1 relative to silicon dioxide in oxygen based anisotropic plasma etch processes. The amorphous carbon underlayer 210 may be deposited by a variety of methods, such as chemical vapor deposition, plasma enhanced chemical vapor deposition, high density plasma chemical vapor deposition, or combinations thereof. The amorphous carbon underlayer 210 may include carbon and hydrogen or carbon, hydrogen, nitrogen, and oxygen, as well as other dopant atoms depending on the specific precursors employed in the deposition.

Figure 2A:
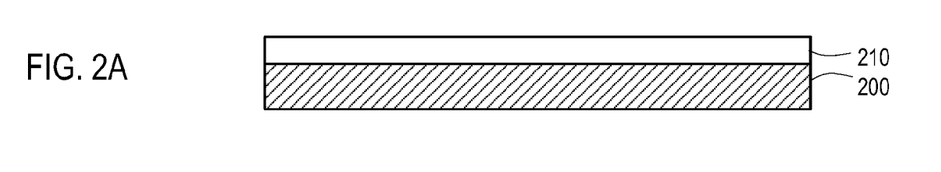
FIGS. 2A-2D show an embodiment of deposition process for depositing a photoresist layer and forming a pattern on a substrate with an underlayer on the substrate.

In one embodiment, the amorphous carbon underlayer 210 is formed from a gas mixture of a hydrocarbon compound and an inert gas such as argon, helium, xenon, krypton, neon, or combinations thereof. In specific embodiments, the carbon source is a gaseous hydrocarbon, and typically an unsaturated hydrocarbon, a material containing a double or triple bond between carbon atoms such that it is prone to polymerization. In one embodiment, the hydrocarbon compound has a general formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$) as well as combinations thereof, may be used as the hydrocarbon compound. Similarly, a variety of gases such as hydrogen, nitrogen, ammonia, or combinations thereof, among others, may be added to the gas mixture, if desired. Ar, He, and $N_2$ may be used to control the density and deposition rate of the amorphous carbon layer. The addition of hydrogen or ammonia can be used to control the hydrogen ratio of the amorphous carbon layer, as discussed below.

In general, the following deposition process parameters can be used to form the amorphous carbon layer. The process parameters range from a wafer temperature of about 100° C. to about 700° C., a chamber pressure of about 1 torr to about 20 torr, a hydrocarbon gas flow rate of about 50 sccm to about 500 sccm an RF power of between about 1 W/in$^2$ and about 100 W/in$^2$, such as between about 3 W/in$^2$ and about 20 W/in$^2$, and a plate spacing of between about 300 mils to about 600 mils. The amorphous carbon layer can be deposited to a thickness between about 200 Angstroms and about 10,000 Angstroms. The above process parameters provide a typical deposition rate for the amorphous carbon layer in the range of about 100 Angstroms/min to about 5,000 Angstroms/min and can be implemented on 200 mm or 300 mm substrates in a deposition chamber available from Applied Materials, Inc. of Santa Clara, Calif. An example of a deposition chamber that may be used is an APF® chamber on the Producer® system, available from Applied Materials, Inc.

Other deposition chambers can be used as well and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc.

The as-deposited amorphous carbon underlayer 210 may have an adjustable carbon:hydrogen ratio that ranges from about 10% hydrogen to about 90% hydrogen. Controlling the hydrogen ratio of the amorphous carbon layer is desirable for tuning its optical properties as well as its etch selectivity. Specifically, as the hydrogen ratio decreases, the optical properties of the as-deposited layer such as for example, the absorption coefficient (k) increases. Similarly, as the hydrogen ratio decreases, the etch resistance of the amorphous carbon underlayer 210 may increase, depending on the etch chemistry used.

Figure 2B:
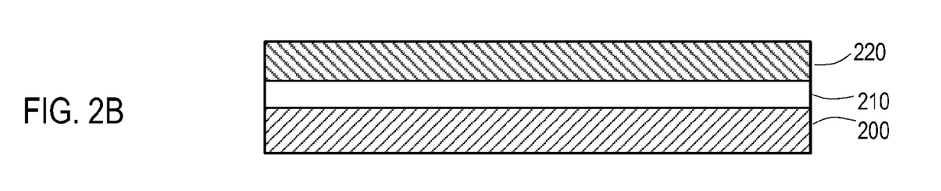
Figure 2C:
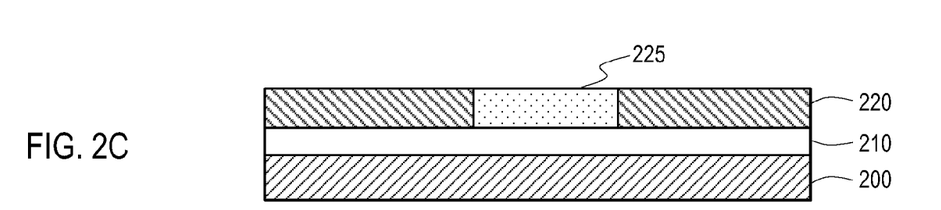
Figure 2D:
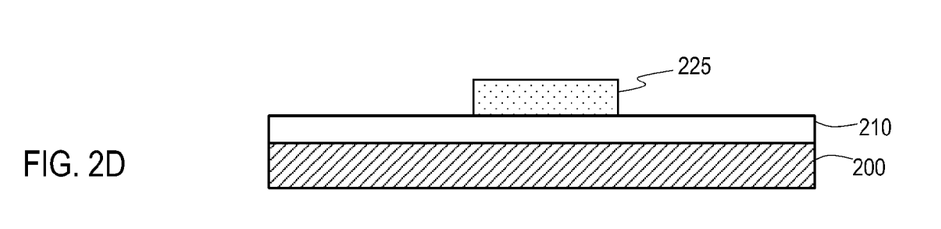

Thus, turning to FIG. 2B, a substrate 200 having an APF underlayer 210 can be utilized in an CVD process sequence for application of a thin radiation sensitive layer 220 of inorganic material which after patterning can serve as a mask for anisotropic plasma etching through for the APF underlayer 210 layer to the substrate 200. A CVD approach to the thin radiation sensitive organic layer could involve any of the CVD processes described above. In this specific case, the substrate temperature and chemistry can be selected specifically not to promote formation of an insoluble oxide precursor material, but to remain soluble unless exposed to e-beam or EUV radiation, thereby providing an effective patterning method. In other embodiments, oxide may be formed, particularly where radiation is carried out in the presence of oxygen. Pattern development is accomplished using a developer solution, for example, a suitable dilute aqueous base similar to that used to develop current resist materials. Irreversible processes induced by selective e-beam or EUV exposure (for example free radical and redox processes) promote the formation of an insoluble cross-linked material in exposed areas, which due to its composition provides an effective mask for the oxygen reactive ion etch transfer of the pattern through the underlying amorphous carbon based layer.

More generally, a CVD process in accordance with one or more embodiments described herein is used to form a layer 220 (shown in FIG. 2B) that can be patterned by radiation. The deposition of the film results in the reactive, cross-linkable moieties present in the precursor to remain partially unreacted in the deposited layer which is soluble in developer solution.

The deposited layer 220 containing partially unreacted, cross-linkable moieties is then selectively exposed to radiation to create a pattern so that exposed portions 225 (shown in FIG. 2C) of the deposited layer contain cross-linked moieties from the precursor that is less soluble to developer solution than unexposed portions of the deposited layer 220. The patterned substrate bearing both cross-linked layer portion 225 and soluble portions of the deposited layer 220 can then be exposed to a developer solution to remove the soluble portions of the deposited layer 220 resulting in the structure shown in FIG. 2D.

EXAMPLES

Example 1

PECVD Deposition of Film Using Trisilylamine and Exposure to Radiation in Vacuum A film was deposited using PECVD and trisilylamine as a precursor. The deposition conditions included a chamber pressure of 4 torr and a temperature of 100° C. The plasma had an RF power of 100 W. The TSA precursor was flowed at a rate of 200 sccm, while nitrogen and hydrogen were each flowed at a rate of 1000 sccm.

The deposited film was then exposed to an e-beam at 25 µC/cm². Development consisted of puddle development for 60 seconds in a 0.26 normal TMAH solution in water.

Figure 3A:
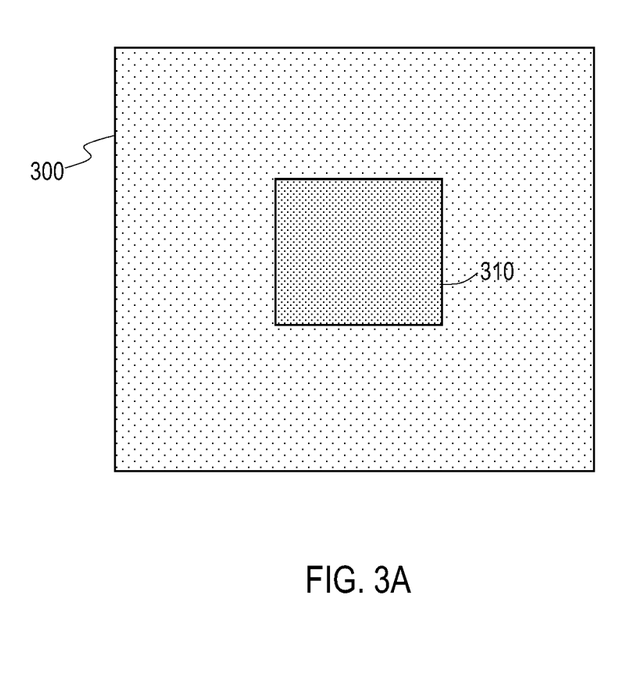
FIGS. 3A-B are a representation of an optical microscope image of a photoresist film, deposited in accordance with an embodiment of the invention, exposed to an electron beam before and after development.
Figure 3B:
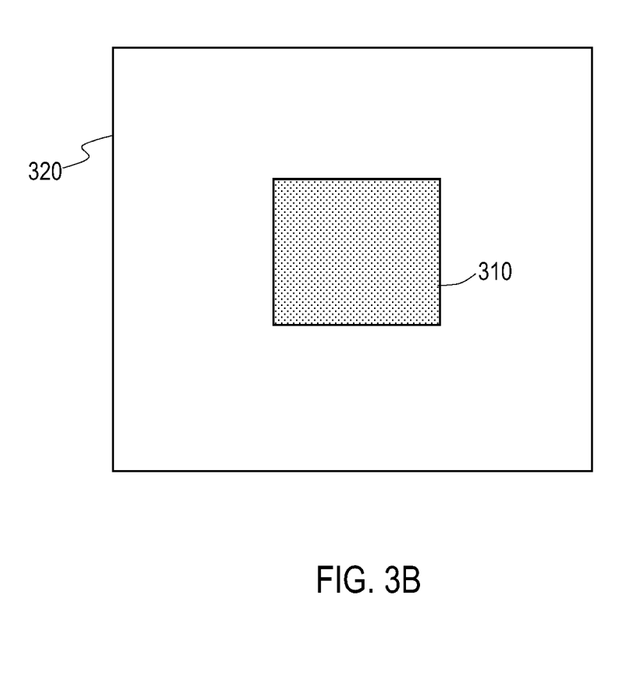

The results showed that the film was sensitive to e-beam exposure carried out in a vacuum. The exposed film was also able to be developed using TMAH. FIGS. 3A and B are representations of optical microscope images taken of the film exposed to the e-beam before (FIG. 3A) and after (FIG. 3B) development. As seen in FIG. 3A, after exposure to the e-beam, a color change was observed in the portion of the film exposed 310, as compared to the portion of the film not exposed 300 to the e-beam. FIG. 3B represents the same area after development with the TMAH solution. The portion exposed to the e-beam 310 remained, while the portion not exposed to the e-beam 300 was removed to leave the underlying substrate.

Figure 4:
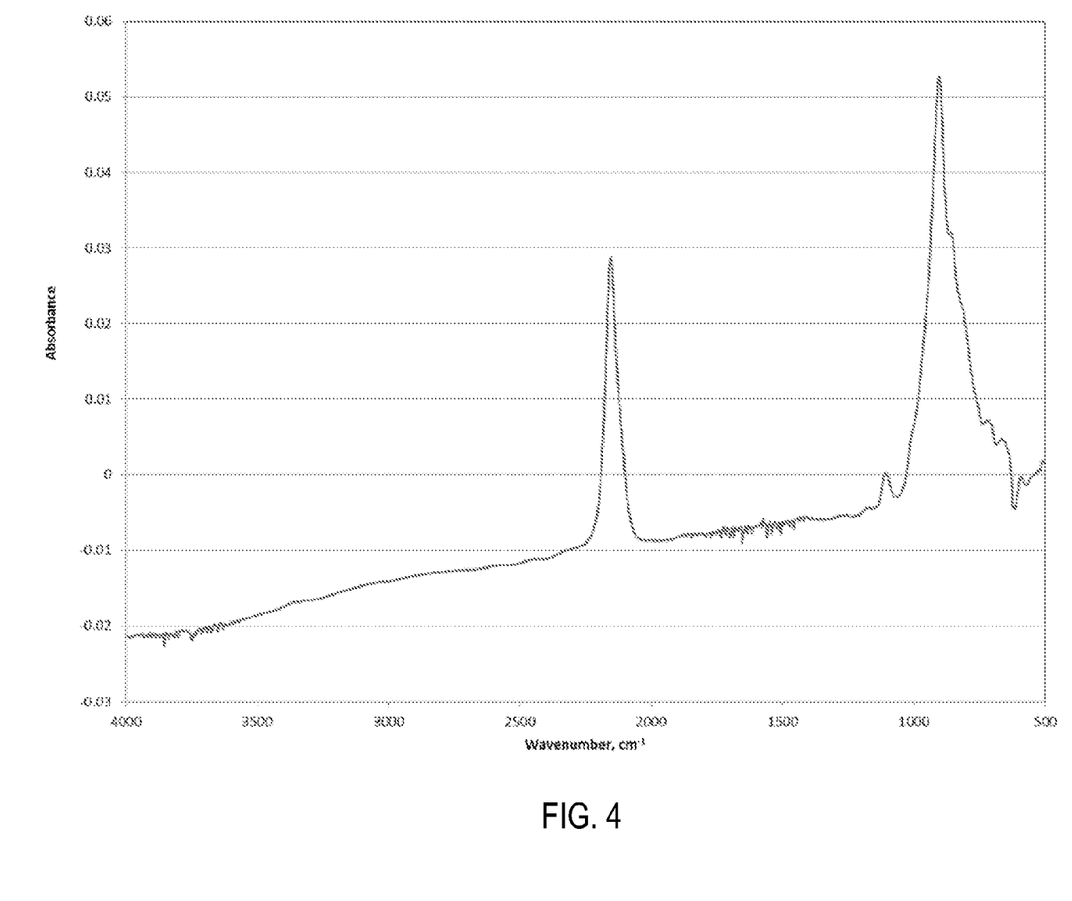
FIG. 4 is Fourier transform infrared spectra of a film deposited in accordance with an embodiment of the invention.

FIG. 4 is FTIR spectra of film characterization. The peak at about 2100 cm$^{-1}$ corresponds to the Si—H bonds. The peak at about 800 cm$^{-1}$ corresponds to the rest of the components of the film, including Si—N bonds.

Example 2

PECVD Deposition of TSA and Exposure to Radiation in Presence of Oxygen

A film was deposited using plasma enhanced chemical vapor deposition. The film stack was comprised of 400 Angstroms of photoresist on 4000 Angstroms of APF. Film deposition was carried out at 4 torr of chamber pressure and at 100 C. The precursor was TSA, and was flowed at 200 sccm. The carrier plasma was a plasma containing argon flowed at 2000 sccm and had an RF value of 100 W. Plate spacing was 300 mil. The deposited film was then exposed to 25 mJ of 193 nm light. Development consisted of puddle development for 60 seconds in a 0.26 normal TMAH solution in water. After development, the film was etched using an oxygen-based plasma.

The deposited film demonstrated patterning using conventional photoresist processing equipment and chemicals. The film also demonstrated utility as a hard mask for etch transfer of features into the substrate.

Figure 5:
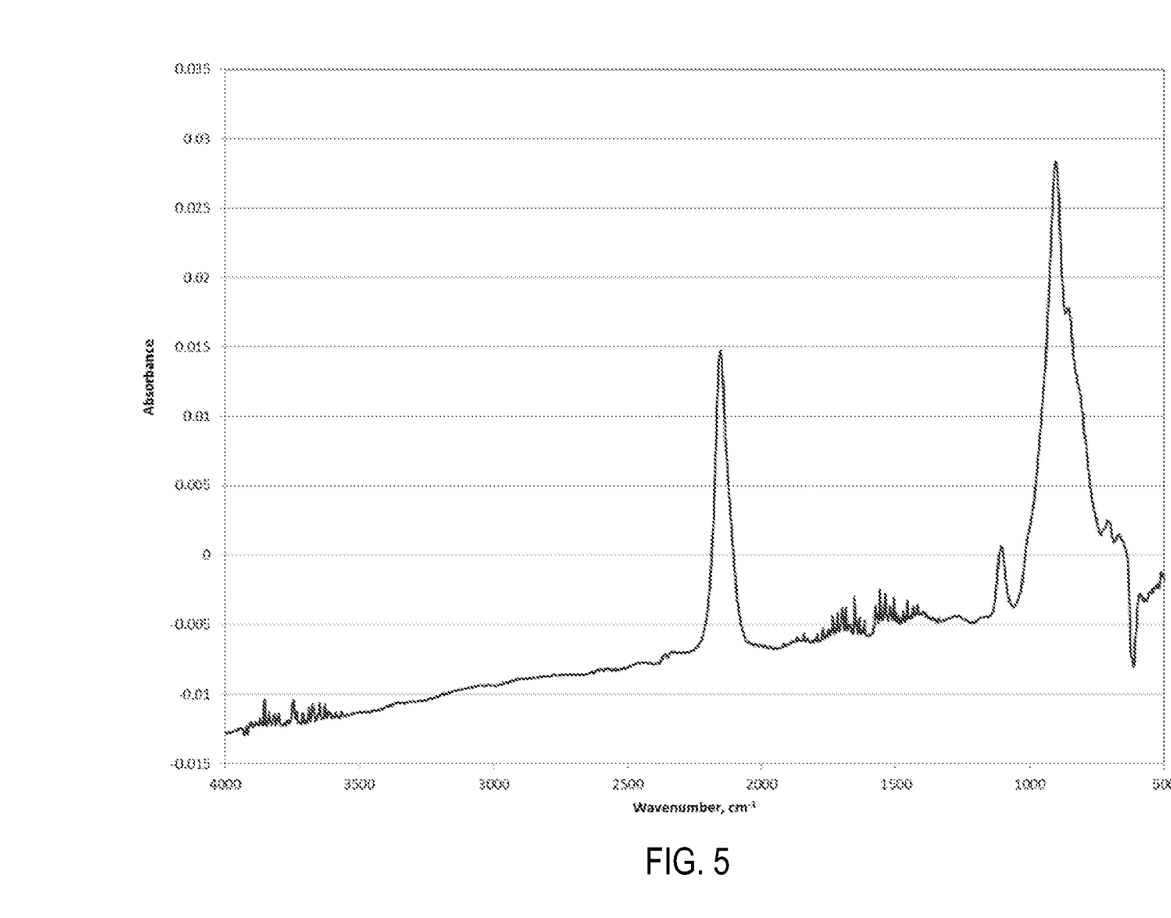
FIG. 5 is Fourier transform infrared spectra of a film deposited in accordance with an embodiment of the invention.

FIG. 5 is FTIR spectra of film characterization of the deposited film. The peak at about 2100 cm$^{-1}$ corresponds to the Si—H bonds. The peak at about 800 cm$^{-1}$ corresponds to the rest of the components of the film, including Si—N bonds.

According to one or more embodiments, many of the primary challenges with radiation such as EUV lithography can be addressed. While embodiments of the invention should not be bound by theory, it is understood that radiation such as EUV photons are absorbed in approximately only the top 200 Angstroms of resist materials, such that more conventional organic formulations typically much thicker than that exhibit resolution loss due to the generation and interactions of secondary electrons spreading deeper into the resist layer. According to one or more embodiments, patterning of the thin CVD resist layer can proceed throughout its thickness and its etch resistance permit patterns to be transferred into underlying films.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method for forming a radiation sensitive photoresist on a substrate comprising:
    forming by chemical vapor deposition a deposited layer by flowing a silicon precursor containing substituents with cross-linkable moieties into a chemical vapor deposition apparatus containing the substrate;
    contacting the deposited layer with a plasma; and
    selectively exposing portions of the deposited layer to radiation to create a pattern having exposed portions and unexposed portions in which the exposed portions of the deposited layer contain cross-linked moieties that form a film on the substrate that are less soluble to developer solution than unexposed portions of the deposited layer.

2. The method of claim 1, wherein exposure to radiation is carried out in a vacuum.

3. The method of claim 2, wherein the radiation is selected from EUV and e-beam.

4. The method of claim 3, further comprising flowing a second precursor comprising germanium or tin, and wherein the radiation is EUV.

5. The method of claim 1, wherein exposure to radiation is carried out in the presence of oxygen.

6. The method of claim 1, wherein the radiation is selected from deep UV, far UV and x-ray.

7. The method of claim 6, wherein the photo-patterned film is used as a hard mask.

8. The method of claim 1, further comprising contacting the unexposed portions of the deposited layer with developer solution and removing the unexposed portions from the substrate.

9. The method of claim 8, wherein the developer solution comprises an aqueous solution of tetramethylammonium hydroxide.

10. The method of claim 1, wherein the silicon precursor comprises an SiH-containing precursor.

11. The method of claim 10, wherein the Si—H containing precursor is selected from trisilylamine, bis(diethylamino)silane, bis(tertiarybutylamino)silane, tris(dimethylamino)silane, and 1,3,5-trisilapentane.

12. The method of claim 1, wherein the plasma is a remote plasma.

13. A method of providing a substantially oxidized photo-patterned film, the method comprising:
    providing a substrate;
    depositing a film onto the substrate using an Si—H containing precursor, wherein deposition comprises plasma-enhanced chemical vapor deposition;
    exposing at least part of the deposited film to to provide a photo-patterned film;
    treating the photo-patterned film to provide a substantially oxidized photo-patterned film.

14. The method of claim 13, wherein treating the photo-patterned film comprises one or more of baking at an elevated temperature, UV curing, exposing the photo-patterned film to ozone, and exposing the photo-patterned film to a plasma containing oxygen.

15. The method of claim 13, wherein the UV light is selected from deep UV and far UV light.

16. The method of claim 13, further comprising contacting the unexposed portions of the deposited layer with developer solution and removing the unexposed portions from the substrate.

17. The method of claim 16, wherein the developer solution is an aqueous tetramethylammonium hydroxide solution.

18. The method of claim 13, wherein the photo-patterned film is used as a hard mask.

19. The method of claim 13, where in the Si—H containing precursor is one or more of trisilylamine, bis(diethylamino)silane, bis(tertiarybutylamino)silane, tris(dimethylamino)silane, and 1,3,5-trisilapentane.

20. A method for forming a patterned photoresist on a substrate comprising:

depositing a layer by chemical vapor deposition on a substrate by flowing an Si—H containing precursor containing cross-linkable moieties into a chemical vapor deposition chamber containing the substrate;

contacting the deposited layer with a plasma, wherein the plasma comprises nitrogen;

selectively exposing portions of the layer to radiation provide exposed portions and unexposed portions to form a pattern in which exposed portions are more cross-linked than unexposed portions;

contacting the unexposed portions of the deposited layer with developer solution, wherein the developer solution comprises TMAH, and removing the unexposed portions from the substrate.

* * * * *